United States Patent
Jin et al.

(10) Patent No.: US 8,455,337 B2
(45) Date of Patent: Jun. 4, 2013

(54) CRYSTALLIZATION APPARATUS, CRYSTALLIZATION METHOD, METHOD OF MANUFACTURING THIN FILM TRANSISTOR AND METHOD OF MANUFACTURING ORGANIC LIGHT EMITTING DISPLAY APPARATUS

(75) Inventors: Seong-Hyun Jin, Yongin (KR); Young-Jin Chang, Yongin (KR); Jae-Hwan Oh, Yongin (KR); Won-Kyu Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/613,923

(22) Filed: Sep. 13, 2012

(65) Prior Publication Data

US 2013/0017630 A1 Jan. 17, 2013

Related U.S. Application Data

(63) Continuation of application No. 12/948,418, filed on Nov. 17, 2010, now abandoned.

(30) Foreign Application Priority Data

Mar. 11, 2010 (KR) .................. 10-2010-0021836

(51) Int. Cl.
*H01L 21/20* (2006.01)
*H01L 21/36* (2006.01)

(52) U.S. Cl.
USPC ............. 438/486; 438/34; 438/487; 257/52

(58) Field of Classification Search
USPC .................. 438/34, 486, 487; 257/52
See application file for complete search history.

(56) References Cited

U.S. PATENT DOCUMENTS

| | | | |
|---|---|---|---|
| 6,594,446 B2 * | 7/2003 | Camm et al. | 392/416 |
| 6,849,831 B2 | 2/2005 | Timans et al. | |
| 7,183,229 B2 * | 2/2007 | Yamanaka | 438/795 |
| 7,232,982 B2 * | 6/2007 | Takami | 250/208.1 |
| 7,534,977 B2 * | 5/2009 | Yamazaki | 219/390 |
| 7,616,872 B2 * | 11/2009 | Camm et al. | 392/416 |
| 8,017,528 B2 * | 9/2011 | Yoneda et al. | 438/799 |
| 2002/0068421 A1 | 6/2002 | Yamazaki et al. | |

FOREIGN PATENT DOCUMENTS

| | | |
|---|---|---|
| JP | 2002-252174 | 6/2002 |
| JP | 2005-056535 | 3/2005 |
| JP | 2006-066902 | 9/2006 |
| KR | 10-2005-0007451 | 1/2005 |
| KR | 10-2008-0047601 | 5/2008 |
| KR | 2009-0098769 | 9/2009 |

OTHER PUBLICATIONS

Registration Determination Certificate dated Nov. 14, 2011 in Korean priority application No. 10-2010-0021836.

* cited by examiner

*Primary Examiner* — Jarrett Stark
*Assistant Examiner* — Nicholas Tobergte
(74) *Attorney, Agent, or Firm* — Knobbe Martens Olson & Bear LLP

(57) ABSTRACT

Provided are a crystallization apparatus and method, which prevent cracks from being generated, a method of manufacturing a thin film transistor (TFT), and a method of manufacturing an organic light emitting display apparatus. The crystallization apparatus includes a chamber for receiving a substrate, a first flash lamp and a second flash lamp, which are disposed facing each other within the chamber, wherein amorphous silicon layers are disposed on a first surface of the substrate facing the first flash lamp and a second surface of the substrate facing the second flash lamp, respectively.

7 Claims, 5 Drawing Sheets

CRYSTALLIZATION APPARATUS, CRYSTALLIZATION METHOD, METHOD OF MANUFACTURING THIN FILM TRANSISTOR AND METHOD OF MANUFACTURING ORGANIC LIGHT EMITTING DISPLAY APPARATUS

CROSS-REFERENCE TO RELATED APPLICATIONS

This application is a continuation of U.S. application Ser. No. 12/948,418 filed Nov. 17, 2010, which claims the benefit of Korean Patent Application No. 10-2010-0021836, filed on Mar. 11, 2010, in the Korean Intellectual Property Office, the disclosure of which is incorporated herein in its entirety by reference.

BACKGROUND

1. Field

The present invention relates to a crystallization apparatus and method which prevent cracks from being generated.

2. Description of the Related Technology

Active matrix (AM) type organic light emitting display apparatuses generally include a pixel driving circuit in respective pixels. The pixel driving circuit typically includes a thin film transistor (TFT) formed using silicon. Amorphous silicon or polycrystalline silicon may be used as the silicon constituting the TFT.

TFTs constituting amorphous silicon (a-Si TFT) include a semiconductor active layer constituting a source, a drain, and a channel formed of amorphous silicon, and the amorphous silicon TFT has low electron mobility. Polycrystalline silicon TFTs generally have high electron mobility and superior light irradiation stability when compared to the amorphous silicon TFT. Thus, polycrystalline silicon TFTs are well adapted for being used as an active layer of a driving and/or switching TFT of an active matrix organic light emitting display apparatus.

The polycrystalline silicon TFT may be manufactured using various methods. Examples include a method in which polycrystalline silicon is directly deposited and a method in which amorphous silicon is deposited and crystallized. The method for depositing the polycrystalline silicon may include a chemical vapor deposition (CVD) method, a photo CVD method, a hydrogen radical (HR) CVD method, an electron cyclotron resonance (ECR) CVD method, a plasma enhanced (PE) CVD method, or a low pressure (LP) CVD method.

The method in which the amorphous silicon is deposited and crystallized may include a solid phase crystallization (SPC) method, an excimer laser crystallization (ELC) method, a metal induced crystallization (MIC) method, a metal induced lateral crystallization (MILC) method, or a sequential lateral solidification (SLS) method.

The SPC method is typically performed at a temperature greater than about 600° C. for a long time, and its practicality may thus be significantly reduced. The ELC method may realize low-temperature crystallization. However, since a laser beam is expanded using an optical unit, uniformity may be deteriorated. The MIC method includes depositing a metal thin film on a surface of amorphous silicon to crystallize the amorphous silicon using the metal thin film as a catalyzer, and a crystallization temperature may thus be reduced. However, since polycrystalline silicon is contaminated by the metal, characteristics of a TFT device including a silicon layer formed by MIC may be deteriorated. Also, formed crystals may have a small size and the crystals may be distributed in a disorderly manner.

SUMMARY OF CERTAIN INVENTIVE ASPECTS

Embodiments of the present invention provide a crystallization apparatus and method, which prevent cracks from being generated, a method of manufacturing a thin film transistor (TFT) and a method of manufacturing an organic light emitting display apparatus.

One aspect is a crystallization apparatus, including: a chamber for receiving a substrate, a first flash lamp and a second flash lamp, which are disposed facing each other within the chamber, wherein amorphous silicon layers are disposed on a first surface of the substrate facing the first flash lamp and a second surface of the substrate facing the second flash lamp, respectively.

The amorphous silicon layer disposed on the first surface may be crystallized by light irradiated from the first flash lamp, and the amorphous silicon layer disposed on the second surface may be crystallized by light irradiated from the second flash lamp.

Two substrates may be provided within the chamber, the amorphous silicon layer may be disposed on a first surface which faces the first flash lamp of the substrate disposed facing the first flash lamp, and the amorphous silicon layer may be disposed on a second surface which faces the second flash lamp of the substrate disposed facing the second flash lamp.

The amorphous silicon layer disposed on the first surface and the amorphous silicon layer disposed on the second surface may be crystallized simultaneously.

The flash lamp may include one selected from the group consisting of a xenon lamp, a xenon-mercury lamp, a krypton lamp, a krypton-mercury lamp, a xenon-krypton lamp, a xenon-krypton-mercury lamp, and a metal halide lamp.

The flash lamp may be controlled with respect to a peak value and a pulse width of a discharge current applied thereto and a repetition speed and frequency of lamp light emission.

Another aspect is a crystallization method, including: providing a work piece in a crystallization chamber, the work piece including a substrate, a first amorphous silicon layer on a first surface of the substrate and a second amorphous silicon layer on a second surface of the substrate, where the first and second surfaces face away from each other, irradiating a first light beam to the first amorphous silicon layer for at least partially crystallizing the first amorphous silicon layer, concurrently irradiating a second light beam to the second amorphous silicon layer for at least partially crystallizing the second amorphous silicon layer.

The crystallization chamber may include a first flash lamp facing the first surface of the substrate and a second flash lamp facing the second surface of the substrate.

The substrate may include a first plate and a second plate, where the first surface is a surface of the first plate and the second surface is a surface of the second plate.

The crystallization method may further include separating the two plates from each other after the amorphous silicon layers are crystallized.

The crystallization method may further include removing at least one of the crystallized silicon layers from the substrate.

The crystallization method may further include dividing the substrate into two parts along a surface parallel to the first surface and the second surface after the amorphous silicon layers are crystallized.

A method of manufacturing a thin film transistor (TFT) including: forming an active layer on a substrate, forming a gate electrode insulated from the active layer, and forming a source electrode and a drain electrode, which are electrically connected to the active layer, where the forming of the active layer includes using the crystallization method above.

A method of manufacturing an organic light emitting display apparatus including: forming a thin film transistor (TFT), and forming an organic light emitting device electrically connected to the TFT, where the forming of the TFT includes: forming an active layer on a substrate, forming a gate electrode insulated from the active layer, and forming a source electrode and a drain electrode, which are electrically connected to the active layer, where the forming of the active layer includes using the crystallization method above.

Another aspect is a crystallization apparatus, including: a first array of lights configured to irradiate light beams in directions that commonly have a component of a first direction, and a second array of lights configured to irradiate light beams in directions that commonly have a component of a second direction that is opposite to the first direction.

The first array of lights may include a first flash lamp, and the second array of lights includes a second flash lamp.

The first and second flash lamps may each include at least one selected from the group consisting of a xenon lamp, a xenon-mercury lamp, a krypton lamp, a krypton-mercury lamp, a xenon-krypton lamp, a xenon-krypton-mercury lamp, and a metal halide lamp.

Each of the first and second flash lamps may be controlled with respect to a peak value and a pulse width of a discharge current applied thereto and a repetition speed and frequency of lamp light emission.

BRIEF DESCRIPTION OF THE DRAWINGS

The above and other features will become more apparent by describing exemplary embodiments with reference to the attached drawings in which.

DETAILED DESCRIPTION OF CERTAIN INVENTIVE EMBODIMENTS

Certain inventive embodiments of the present invention will be described with reference to the accompanying drawings.

A flash lamp crystallization (FLC) method represents a method in which high-energy light having a visible light range is irradiated onto a substrate one time or several times for a short period of time (typically, 1 μsec to 1 msec) using a flash lamp filled with xenon (Xe) gas to instantly crystallize the entire substrate. As a result, a high carrier concentration of a particle having a large diameter and a high-quality polycrystalline silicon thin film may be obtained to significantly improve productivity and significantly reduce manufacturing costs.

Figure 1:
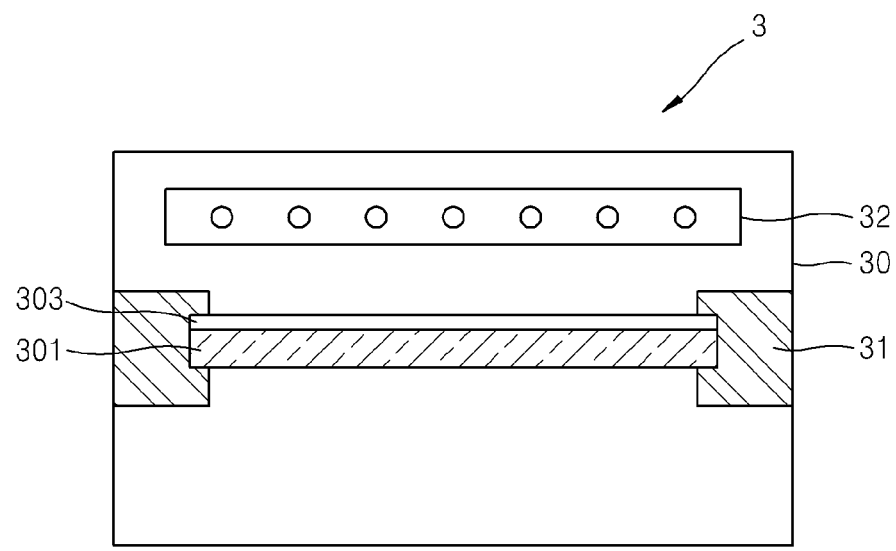
FIG. 1 is a schematic view of a crystallization apparatus

FIG. 1 is a schematic view of a crystallization apparatus.

Referring to FIG. 1, a crystallization apparatus includes a chamber, a fixing chuck disposed within the chamber, and a flash lamp. A substrate on which amorphous silicon layer is disposed on a surface thereof is disposed within the crystallization apparatus.

However, when the FLC method is applied, a temperature difference between the top and bottom surfaces of the substrate may be generated instantly. As a result, fine cracks may be generated. When light emitted from the flash lamp irradiates the substrate, the amorphous silicon disposed on the top surface of the substrate is expanded to apply a tensile force to the surface of the substrate. When the irradiation of the light is stopped, the amorphous silicon disposed on the top surface of the substrate is cooled to apply a compression force to the surface of the substrate. As a result, due to the sudden temperature difference between the top and bottom surfaces of the substrate, the tensile force and the compression force are alternately applied to the surface of the substrate and thus fine cracks are generated on the surface of the substrate.

Figure 2:
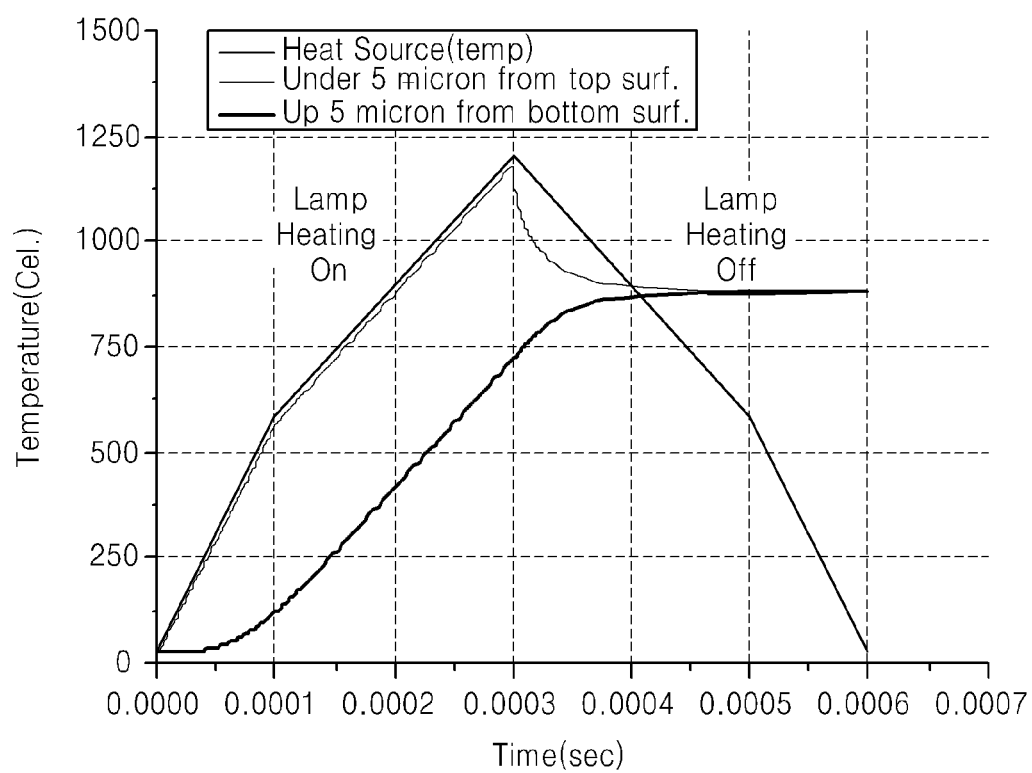
FIG. 2 is a graph illustrating temperature distribution on top and bottom surfaces of the substrate in FIG. 1.

Referring to FIG. 2, which illustrates temperature distribution on the top and bottom surfaces of the substrate when the light emitted from the flash lamp irradiates the substrate, it may be seen that a sudden temperature difference between the top and bottom surfaces of the substrate is greater than about 500° C. With such a temperature difference between the top and bottom surfaces of the substrate, stress is applied to the substrate thus generating the fine cracks in the substrate.

To solve the above-described limitation, an embodiment of the crystallization apparatus may include two flash lamps facing each other. A substrate may be disposed between the two flash lamps. Amorphous silicon layers may be disposed on both surfaces of the substrate, respectively. Thus, the flash-irradiation is performed on the substrate in a state where the top surface of the substrate has the same condition as the bottom surface of the substrate to prevent the cracks from being generated in the substrate.

Figure 3:
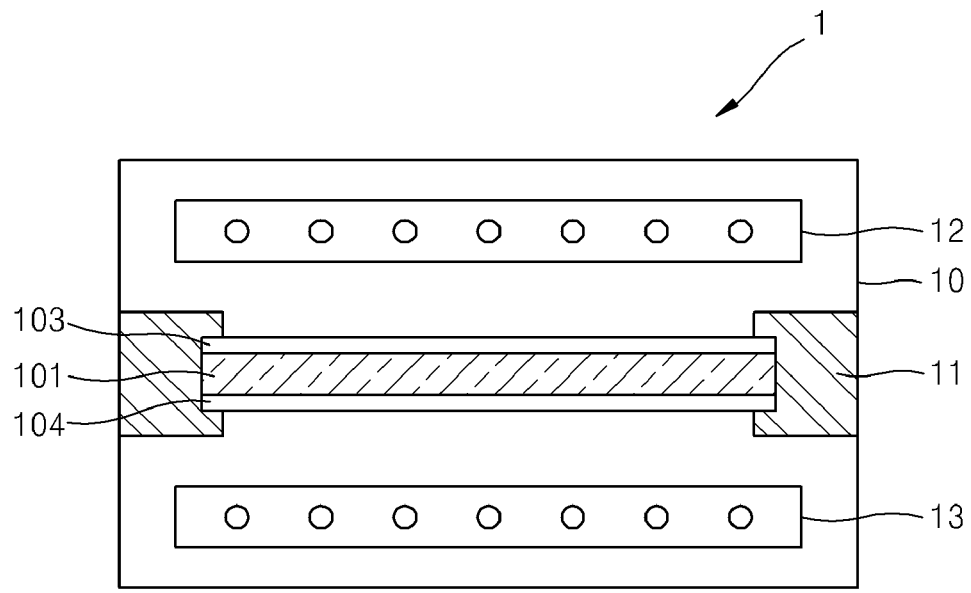
FIG. 3 is a schematic view of an embodiment of a crystallization apparatus.

Referring to FIG. 3, an embodiment of a crystallization apparatus 1 includes a chamber 10, a fixing chuck 11 disposed within the chamber 10, and a first flash lamp 12 and a second flash lamp 13. A substrate 101 on which amorphous silicon layers 103 and 104 are disposed on top and bottom surfaces thereof is disposed within the crystallization apparatus 1. The substrate 101 is fixed in its position by the fixing chuck 11.

The flash lamps 12 and 13 are disposed above and below upper and lower portions of the substrate 101, respectively. As described above, the FLC method represents a method in which high-energy light is irradiated using a flash lamp for a short period of time to instantly crystallize the entire substrate.

According to the flash lamp crystallization method, any number of lamps is combined, and the substrate or the flash irradiation light moves in any direction and at any speed to control thermal fusion and cooling speed. Thus, since the amorphous silicon layer having a large area is poly- or single-crystallized for a very short period of time, manufacturing productivity may be significantly improved and manufacturing costs may be significantly reduced. The flash irradiation light may be condensed in any linear, rectangular, square, or circular shape to be irradiated as condensed light. Thus, fusion efficiency, manufacturing yield, and crystallization uniformity may be improved to reduce a difference in carrier mobility.

In some embodiments, xenon lamps, xenon-mercury lamps, krypton lamps, krypton-mercury lamps, xenon-krypton lamps, xenon-krypton-mercury lamps, and metal halide lamps may be used as the flash lamp. The lamps may endure repeated light emission. Also, the lamps may have a lower price and a longer life than an excimer laser oscillator using XeCl and KrF. The lamps may also be more easily repaired compared to the excimer laser oscillator. Thus, manufacturing costs of the lamps may be significantly reduced.

Embodiments of the method for crystallizing the amorphous silicon using the flash lamp may include lamp flash irradiation in which the flash lamp flash-irradiates a large area at least one time at once, scanning irradiation in which the flash lamp irradiates the same region at least one time while flash-irradiating the same region, and a stepped and/or repeated irradiation in which the flash lamp flash-irradiates a substrate at least one time while the substrate relatively steppedly and/or repeatedly moves with respect to flash irradiation light. The flash irradiation light may be overlappingly irradiated to repeatedly flash-irradiate the same region once or a number of times.

The substrate 101, on the top and bottom surfaces of which the amorphous silicon layers 103 and 104 are respectively disposed, is disposed within the crystallization apparatus 1.

The first amorphous silicon layer 103 is disposed on one surface of the substrate 101, and the second amorphous silicon layer 104 is disposed on the other surface of the substrate 101. The light of the first flash lamp 12 is irradiated onto the first amorphous silicon layer 103, and simultaneously, the light of the second flash lamp 13 is irradiated onto the second amorphous silicon layer 104. Thus, since the crystallization process is performed in a state where both surfaces of the substrate 101 have the same condition, cracks may be prevented from being generated by a significant temperature difference between the top and bottom surfaces of the substrate 101.

Figure 4:
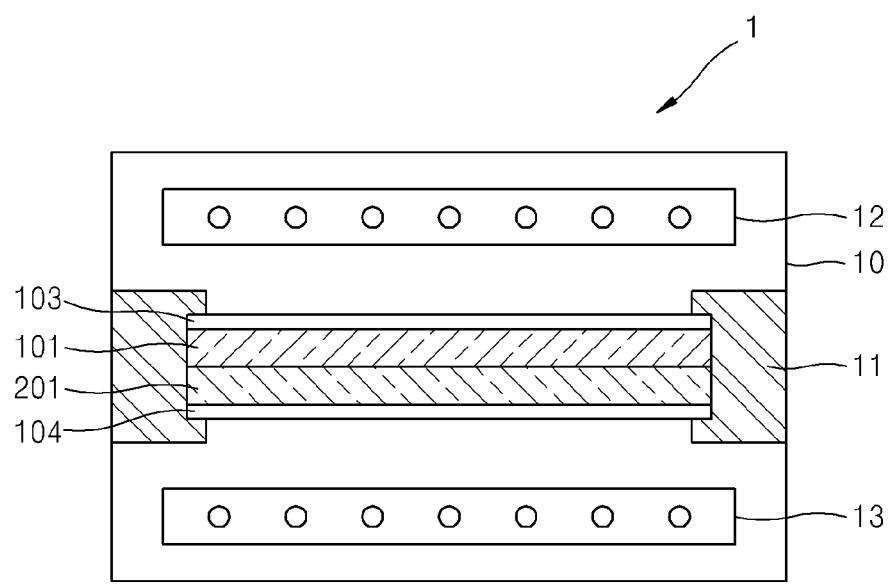
FIG. 4 is a schematic view illustrating another embodiment of a crystallization apparatus.

FIG. 4 is a schematic view illustrating another embodiment of a crystallization apparatus.

Referring to FIG. 4, another embodiment of a crystallization apparatus may include two substrates, i.e., a first substrate 101 and a second substrate 201 to prevent cracks from being generated by an environmental difference between the top and bottom surfaces of the substrates 101 and 201. In some embodiments, the substrate may comprise one or more layers of different materials. In some embodiments, the substrate may consist of 2 separate plates of materials. Amorphous silicon layers 103 and 104 are disposed on surfaces of the two substrates 101 and 201 facing flash lamps 12 and 13, respectively. The two substrates 101 and 201 overlap each other. Thus, in the embodiment of the crystallization apparatus, the cracks due to the environmental difference between the top and bottom surfaces of the overlapping substrates 101 and 201 may be prevented from being generated. Also, since the two substrates 101 and 201 are crystallized at the same time, a manufacturing yield may be further improved.

Figure 5A:
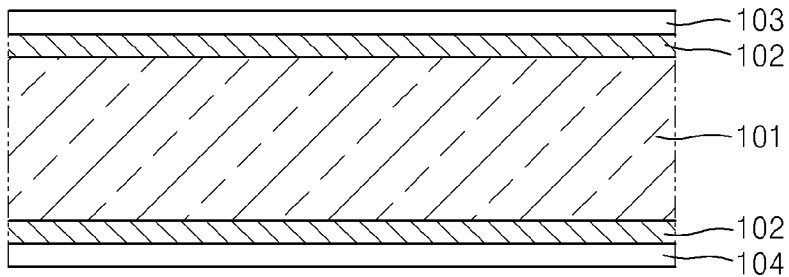
FIGS. 5A to 5C are cross-sectional views illustrating an embodiment of a crystallization method.
Figure 5B:
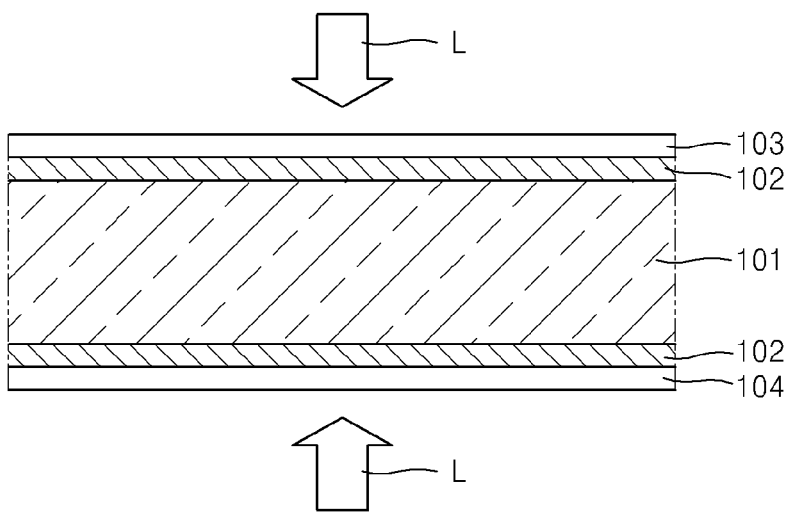
Figure 5C:
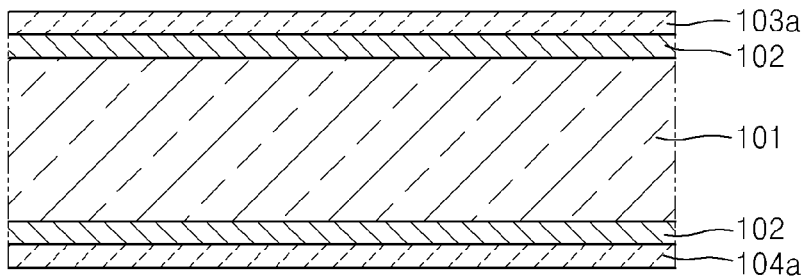

FIGS. 5A to 5C are cross-sectional views illustrating an embodiment of a crystallization method.

Referring to FIG. 5A, a buffer layer 102 and a first amorphous silicon layer 103 are formed on one surface of a substrate 101. A buffer layer 102 and a second amorphous silicon layer 104 are formed on the other surface of the substrate 101.

In some embodiments, the substrate 101 may be formed of a transparent glass material containing $SiO_2$ as a main component. In other embodiments, the substrate 101 may be formed of a transparent plastic material. The plastic substrate may be formed of an organic insulating material selected from the group consisting of polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), triacetyl cellulose (TAC), cellulose acetate propionate (CAP) and the like.

In yet other embodiments, the substrate 101 may be formed of a metal. In such embodiments, the substrate 101 may include at least one selected from the group consisting of iron, chrome, manganese, nickel, titanium, molybdenum, stainless steel (SUS), Invar alloy, Inconel alloy, Kovar alloy, and the like. In some embodiments, the substrate 101 may have a foil shape.

A buffer layer 102 may be formed on the substrate 101 to planarize a surface of the substrate 101 and to prevent impurity elements from permeating into the substrate 101. In some embodiments, the buffer layer 102 may be formed of $SiO_2$ and/or $SiN_x$. In some embodiments, the buffer 102 may be formed on the top surface and the bottom surface of the substrate 101.

Amorphous silicon layers 103 and 104 are formed on the substrate 101. The amorphous silicon layers 103 and 104 may be formed using various processes. In one embodiment, a chemical vapor deposition (CVD) process may be performed to form the amorphous silicon layers 103 and 104.

Referring to FIG. 5B, light L emitted from each of flash lamps is irradiated onto a surface of the substrate 101. A high pressure pulse generated in a discharge mechanism applied to the flash lamps (12 and 13 of FIG. 3) causes a dielectric breakdown to occur due to xenon gas sealed within the flash lamps. As a result, electrical energy accumulated in a condenser is emitted into the lamps at once for a very short period of time (1 μsec to 1 msec) to emit a glint of light (flash) as a result of an intensive arc discharge. The flash is absorbed into the amorphous silicon layers 103 and 104 to fuse the amorphous silicon layers 103 and 104. In some embodiments, the light L emitted from the flash lamps (see reference numerals 12 and 13 of FIG. 3) may have a wavelength of luminous intensity corresponding to an absorption wavelength (an ultraviolet region, less than about 400 nm) of the respective amorphous silicon layers 103 and 104.

As shown in FIG. 5C, crystalline silicon layers 103a and 104a are formed through the flash lamp crystallization. In some embodiments, the crystalline silicon layers 103a and 104a include polycrystalline silicon.

In some embodiments, any layer of the crystalline silicon layers 103a and 104a formed on surfaces of the substrate 101 may be removed. In other embodiments, the substrate 101 on which the crystalline silicon layers 103a and 104a are formed on both surfaces thereof may be divided in half using a laser, thereby forming two substrates on which the crystalline silicon layer is formed on one surface thereof. In yet other embodiments, the first substrate 101 and the second substrate 201 may be provided to separate the first and second substrates 101 and 201 from each other after the amorphous silicon layers 103 and 104 are respectively formed on the surfaces facing the flash lamps 12 and 13 to crystallize the amorphous silicon layers 103 and 104.

The crystallization method may be applicable to various fields. The crystallization method may be applicable to a method of manufacturing a thin film transistor (TFT) and a method of manufacturing an organic light emitting display apparatus.

Figure 6A:
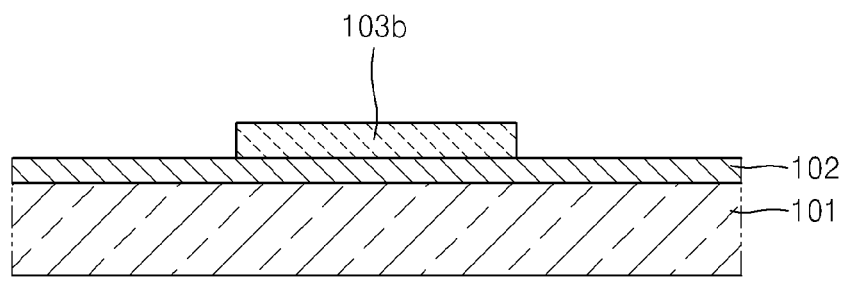
FIGS. 6A to 6C are cross-sectional views illustrating an embodiment of a method of manufacturing a thin film transistor (TFT)
Figure 6B:
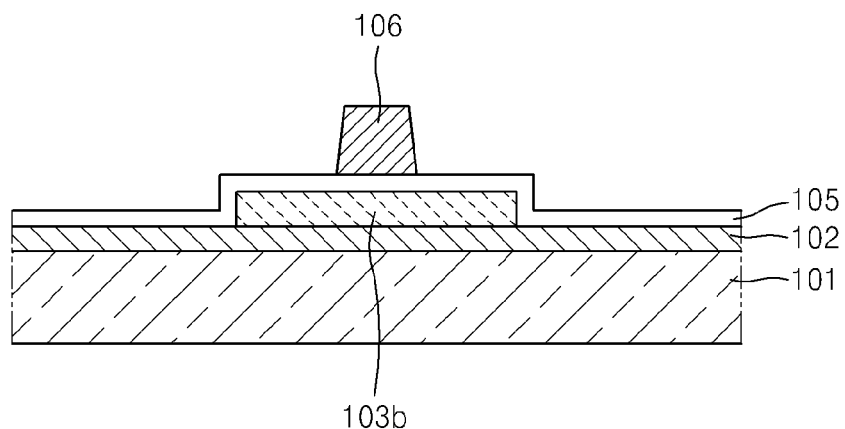
Figure 6C:
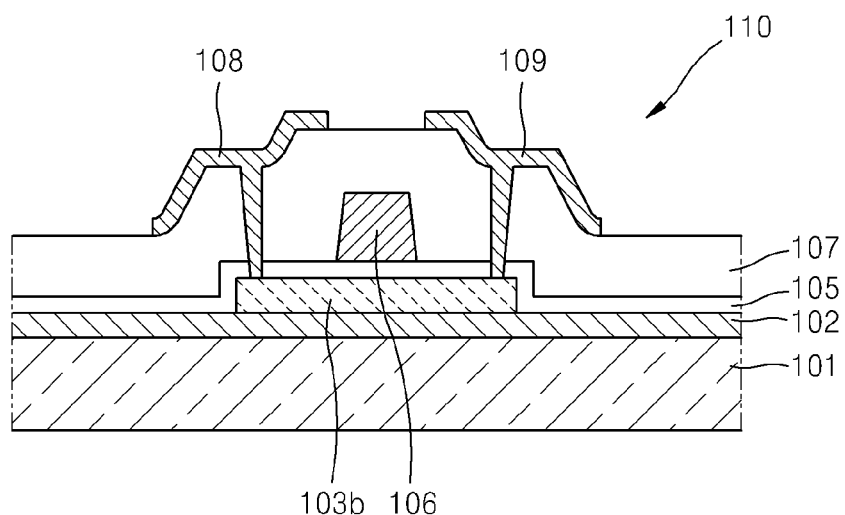

FIGS. 6A to 6C are cross-sectional views illustrating an embodiment of a method of manufacturing a TFT. The embodiment of a method of manufacturing a TFT uses one of the embodiments of crystallization method. Thus, for convenience of description, duplicated descriptions of the above-described embodiment of FIGS. 5A to 5C will be omitted, and subsequent processes will be described.

Referring to FIG. 6A, the crystalline silicon layer (see reference numeral 103a of FIG. 5C) is patterned into a predetermined shape to form an active layer 103b. A photolithography process may be performed to pattern the crystalline silicon layer, thereby forming the active layer 103b.

Referring to FIG. 6B, a gate dielectric 105 and a gate electrode 106 are formed on the active layer 103b. The gate dielectric 105 may be formed using various insulating materials to insulate the active layer 103b from the gate electrode 106. The gate electrode 106 may be formed of various metals and metal alloys.

In some embodiments, impurities may be doped into the active layer 103b by using the gate electrode 106 as a mask to form a source region and a drain region in the active layer 103b.

Referring to FIG. 6C, an interlayer dielectric 107 is formed to cover the gate electrode 106. A source electrode 108 and a drain electrode 109 are formed on the interlayer dielectric 107. The source electrode 108 and the drain electrode 109 are connected to the source region and the drain region of the active layer 103b, respectively. In some embodiments, the TFT 110 has a top gate structure. In some embodiments, the TFT may use the crystalline silicon layer as the active layer.

In one embodiment of a method of manufacturing the TFT, the flash lamp may irradiate the amorphous silicon layer to perform the crystallization process, thereby forming the active layer 103b. The high-quality polycrystalline silicon thin film may be obtained through the flash lamp crystallization process to significantly improve productivity and significantly reduce manufacturing costs.

Figure 7A:
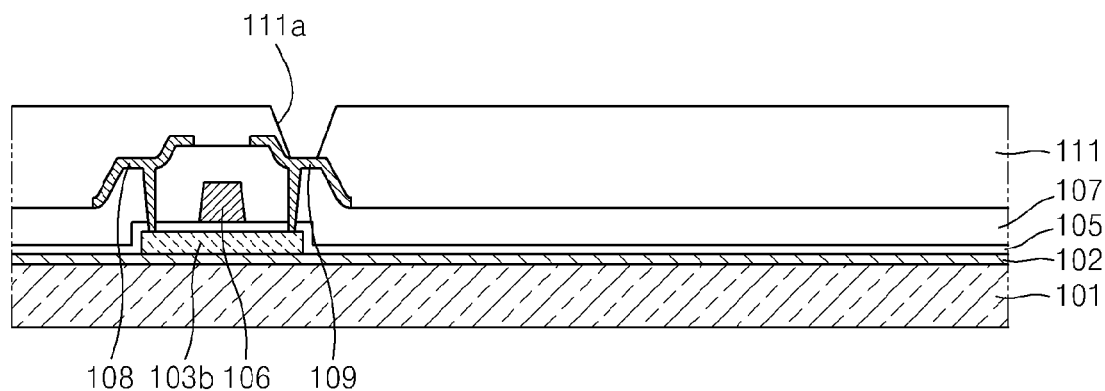
FIGS. 7A and 7B are cross-sectional views illustrating an embodiment of a method of manufacturing an organic light emitting display apparatus.
Figure 7B:
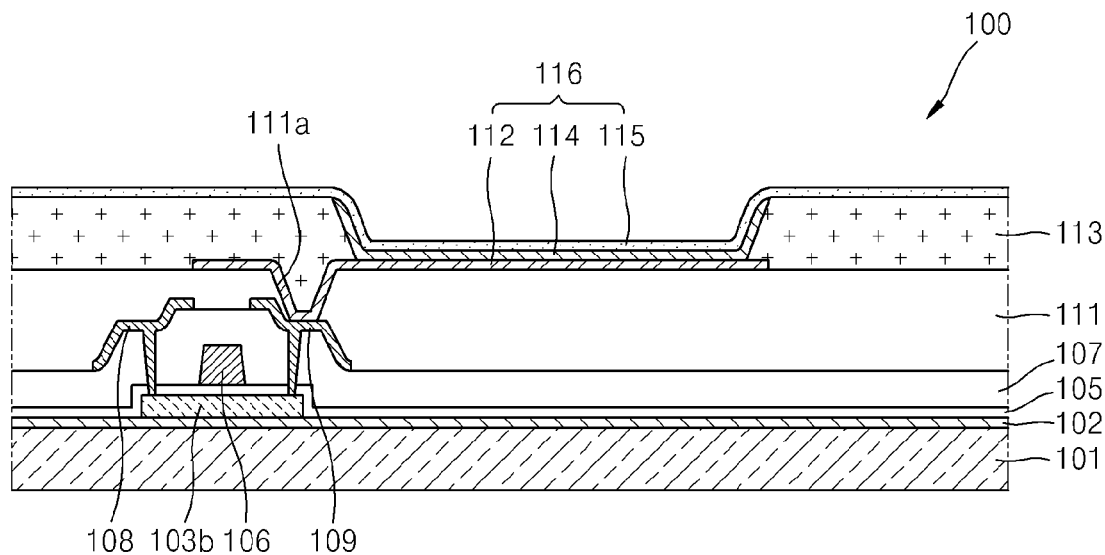

FIGS. 7A and 7B are cross-sectional views illustrating an embodiment of a method of manufacturing an organic light emitting display apparatus. The embodiment of a method of manufacturing an organic light emitting display apparatus uses embodiments of the crystallization method and the method of manufacturing the TFT. Thus, for convenience of description, duplicated descriptions with the above-described embodiment of FIGS. 5A to 5C and FIGS. 6A to 6C will be omitted, and subsequent processes will be described.

Referring to FIG. 7A, a planarization layer 111 having a via hole 111a is formed on the source electrode 108 and the drain electrode 109. In some embodiments, planarization layer 111 may be formed of an insulating material including an organic material or an inorganic material.

Referring to FIG. 7B, an organic light emitting device 116 is formed to be electrically connected to the drain electrode 109. The organic light emitting device 116 includes a first electrode 112, an intermediate layer 114 including an organic light emitting layer, and a second electrode 115.

The first electrode 112 formed on the planarization layer 111 may be formed as a transparent electrode or a reflective electrode. In embodiments where the first electrode 112 is formed as the transparent electrode, the first electrode 112 may be formed of ITO, IZO, ZnO, $In_2O_3$ or the like. In embodiments where the first electrode 112 is formed as the reflective electrode, a reflective layer may be formed of Ag, Mg, Al, Pt, Pd, Au, Ni, Nd, Ir, Cr or a compound thereof, and a layer formed of ITO, IZO, ZnO, $In_2O_3$ or the like may be formed on the reflective layer to form the first electrode 112. The first electrode 112 may contact any one of the source electrode 108 and the drain electrode 109 through the via hole 111a.

A pixel defining layer 113 is formed on the first electrode 112. The pixel defining layer 113 may be formed of an organic material or an inorganic material. The pixel defining layer 113 exposes a predetermined region of the first electrode 112.

The intermediate layer 114 is formed to contact the first electrode 112. The intermediate layer 114 includes the organic light emitting layer. The intermediate layer 114 emits light by electrical driving of the first electrode 112 and the second electrode 115. The intermediate layer 114 is formed of an organic material. In embodiments where the organic light emitting layer of the intermediate layer 114 is formed of a low-molecular organic material, a hole transport layer (HTL) (not shown) and a hole injection layer (HIL) (not shown) are stacked in a direction of the first electrode 112 with respect to the organic light emitting layer, and an electron transport layer (ETL) (not shown) and an electron injection layer (EIL) (not shown) are stacked in a direction of the second electrode 115. In some embodiments, various layers may be stacked. In some embodiments, the low-molecular organic material used for the intermediate layer 114 may include copper phthalocyanine (CuPc), N,N'-Di(naphthalene-1-yl)-N,N'-diphenyl-benzidine (NPB), tris-8-hydroxyquinoline aluminum (AlQ3) and the like.

In embodiments where the organic light emitting layer of the intermediate layer 114 is formed of a high-molecular organic material, the intermediate layer 114 may include only the hole transport layer (HTL) in the direction of the first electrode 112 with respect to the organic light emitting layer. In some embodiments, an ink-jet printing or spin coating process may be performed using poly-(2,4)-ethylene-dihydroxy thiophene (PEDOT), polyaniline (PANI) or the like to form the high-molecular HTL on the first electrode 112. In some embodiments, the high-molecular organic light emitting layer may be formed of PPV, Soluble PPV's, Cyano-PPV, polyfluorene or the like. In some embodiments, an ink-jet printing process, a spin coating process, a thermal transfer process using a laser, or the like, may be performed to form a color pattern.

The second electrode 115 is formed on the intermediate layer 114. In some embodiments, metal having a low work function, for example, Ag, Mg, Al, Pt, Pd, Au, Ni, Nd, Ir, Cr, Li, Ca, or a compound thereof may be deposited, and a transparent conductive material such as ITO, IZO, ZnO, $In_2O_3$ or the like may be deposited on the deposited metal to form the second electrode 115.

A sealing member (not shown) may be disposed on the second electrode 115. The sealing member protects the intermediate layer 114 and other layers from external moisture or oxygen. The sealing member may be formed of a transparent material. In some embodiments, the sealing member may have a multi-layered structure in which a glass, a plastic, or an organic material and an inorganic material overlap each other.

According to embodiments of the present invention, an amorphous silicon layer is crystallized using the flash lamp crystallization (FLC) method, and cracks may be prevented from being generated in the substrate and the manufacturing yield may be improved.

While embodiments of the present invention have been particularly shown and described, it will be understood by those of ordinary skill in the art that various changes in form and details may be made therein without departing from the spirit and scope of the present invention.

What is claimed is:
1. A crystallization method, comprising:
providing a crystallization chamber, wherein the crystallization chamber comprises a first flash lamp and a second flash lamp facing the first flash lamp;

providing a substrate, the substrate comprising a first amorphous silicon layer on a first surface of the substrate and a second amorphous silicon layer on a second surface of the substrate, wherein the first and second surfaces face away from each other;

placing the substrate in the crystallization chamber such that the first surface faces the first flash lamp and the second surface faces the second flash lamp;

irradiating a first light beam from the first flash lamp to the first amorphous silicon layer for at least partially crystallizing the first amorphous silicon layer; and concurrently irradiating a second light beam from the second flash lamp to the second amorphous silicon layer for at least partially crystallizing the second amorphous silicon layer.

2. The crystallization method of claim 1, wherein the substrate comprises a first plate and a second plate, wherein the first surface is a surface of the first plate and the second surface is a surface of the second plate.

3. The crystallization method of claim 2, further comprising separating the two plates from each other after the amorphous silicon layers are crystallized.

4. The crystallization method of claim 1, further comprising removing at least one of the crystallized silicon layers from the substrate.

5. The crystallization method of claim 1, further comprising dividing the substrate into two parts along a surface parallel to the first surface and the second surface after the amorphous silicon layers are crystallized.

6. A method of manufacturing a thin film transistor (TFT), the method comprising:

forming an active layer on a substrate;

forming a gate electrode insulated from the active layer; and forming a source electrode and a drain electrode, which are electrically connected to the active layer, wherein the forming of the active layer comprises:

providing a crystallization chamber, wherein the crystallization chamber comprises a first flash lamp and a second flash lamp facing the first flash lamp;

providing a substrate, the substrate comprising a first amorphous silicon layer on a first surface of the substrate and a second amorphous silicon layer on a second surface of the substrate, wherein the first and second surfaces face away from each other;

placing the substrate in the crystallization chamber such that the first surface faces the first flash lamp and the second surface faces the second flash lamp;

irradiating a first light beam from the first flash lamp to the first amorphous silicon layer for at least partially crystallizing the first amorphous silicon layer; and concurrently irradiating a second light beam from the second flash lamp to the second amorphous silicon layer for at least partially crystallizing the second amorphous silicon layer.

7. A method of manufacturing an organic light emitting display apparatus, the method comprising:

forming a thin film transistor (TFT); and forming an organic light emitting device electrically connected to the TFT, wherein the forming of the TFT comprises:

forming an active layer on a substrate;

forming a gate electrode insulated from the active layer; and forming a source electrode and a drain electrode, which are electrically connected to the active layer, wherein the forming of the active layer comprises:

providing a crystallization chamber, wherein the crystallization chamber comprises a first flash lamp and a second flash lamp facing the first flash lamp;

providing a substrate, the substrate comprising a first amorphous silicon layer on a first surface of the substrate and a second amorphous silicon layer on a second surface of the substrate, wherein the first and second surfaces face away from each other;

placing the substrate in the crystallization chamber such that the first surface faces the first flash lamp and the second surface faces the second flash lamp;

irradiating a first light beam from the first flash lamp to the first amorphous silicon layer for at least partially crystallizing the first amorphous silicon layer; and concurrently irradiating a second light beam from the second flash lamp to the second amorphous silicon layer for at least partially crystallizing the second amorphous silicon layer.

* * * * *